(12) United States Patent
Saito et al.

(10) Patent No.: US 7,462,909 B2
(45) Date of Patent: Dec. 9, 2008

(54) SEMICONDUCTOR DEVICE AND METHOD OF FABRICATING THE SAME

(75) Inventors: Wataru Saito, Kawasaki (JP); Ichiro Omura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 294 days.

(21) Appl. No.: 11/453,997

(22) Filed: Jun. 16, 2006

(65) Prior Publication Data
US 2006/0284248 A1 Dec. 21, 2006

(30) Foreign Application Priority Data
Jun. 20, 2005 (JP) .............................. 2005-178834

(51) Int. Cl.
*H01L 29/76* (2006.01)
(52) U.S. Cl. ............... 257/329; 257/341; 257/E29.027; 257/E29.262
(58) Field of Classification Search ................. 257/329, 257/341, E29.027, E29.262
See application file for complete search history.

(56) References Cited

U.S. PATENT DOCUMENTS

| | | | |
|---|---|---|---|
| 6,639,260 B2 | 10/2003 | Suzuki et al. | |
| 6,677,643 B2 | 1/2004 | Iwamoto et al. | |
| 6,693,338 B2 | 2/2004 | Saitoh et al. | |
| 6,700,141 B2 | 3/2004 | Iwamoto et al. | |
| 6,844,592 B2 | 1/2005 | Yamaguchi et al. | |
| 7,049,658 B2 | 5/2006 | Saito et al. | |
| 7,372,100 B2 * | 5/2008 | Saito .......................... | 257/329 |
| 2004/0043565 A1 | 3/2004 | Yamaguchi et al. | |
| 2006/0216896 A1 * | 9/2006 | Saito et al. ................... | 438/270 |
| 2006/0220156 A1 * | 10/2006 | Saito et al. ................... | 257/409 |
| 2006/0231917 A1 * | 10/2006 | Ono et al. .................... | 257/500 |

FOREIGN PATENT DOCUMENTS

JP 2003-273355 9/2003

* cited by examiner

*Primary Examiner*—Zandra Smith
*Assistant Examiner*—Telly D Green
(74) *Attorney, Agent, or Firm*—Oblon, Spivak, McClelland, Maier & Neustadt, P.C.

(57) ABSTRACT

First semiconductor pillar layers of a first conduction type and second semiconductor pillar layers of a second conduction type are arranged on a first semiconductor layer of the first conduction type laterally, periodically and alternately at a first period to form a first pillar layer. Third semiconductor pillar layers of the first conduction type and fourth semiconductor pillar layers of the second conduction type are arranged on the first pillar layer laterally, periodically and alternately at a second period smaller than the first period to form a second pillar layer. A semiconductor base layer of the second conduction type is formed on a surface of the fourth semiconductor pillar layer. A semiconductor diffused layer of the first conduction type is formed on a surface of the semiconductor base layer.

17 Claims, 14 Drawing Sheets

SEMICONDUCTOR DEVICE AND METHOD OF FABRICATING THE SAME

CROSS REFERENCE TO RELATED APPLICATION

This application is based on and claims the benefit of priority from prior Japanese Patent Application No. 2005-178834, filed on Jun. 20, 2005, the entire contents of which are incorporated herein by reference.

BACKGROUND OF THE INVENTION

1. Field of the Invention

The present invention relates to a semiconductor device and a method of fabricating the same. More particularly, it relates to a semiconductor device having a superjunction structure with p-type pillar layers and n-type pillar layers buried in a drift layer laterally and alternately, and a method of fabricating the same.

2. Description of the Related Art

A vertical power MOSFET has an on-resistance greatly dependent on the electrical resistance in a conduction layer (drift layer) thereof. The electrical resistance in the drift layer is determined from its impurity concentration, and the on-resistance can be lowered as the impurity concentration is made higher. A higher impurity concentration, however, lowers the breakdown voltage across a PN junction formed by the drift layer together with a base layer. Accordingly, the impurity concentration can not be made higher than the limit determined in accordance with the breakdown voltage. Thus, there is a tradeoff between the device breakdown voltage and the on-resistance. An improvement in tradeoff is one important subject matter to provide a semiconductor device of low power dissipation. The tradeoff has a limit determined from device material, and exceeding the limit is a way to realize a low-on-resistance semiconductor device.

As an example of the MOSFET to solve the problem, there is a known structure, which is referred to as a superjunction structure with p-type pillar layers and n-type pillar layers buried in a drift layer laterally and alternately (for example, JP-A 2003-273355). In the superjunction structure, the quantities of charges (the quantities of impurities) contained in the p-type pillar layers and the n-type pillar layers are equalized to artificially create a non-doped layer. This is effective to retain a high breakdown voltage and cause a current flowing through highly doped, n-type pillar layers, thereby realizing a low on-resistance that exceeds the material limit.

The breakdown voltage of the MOSFET having such the superjunction structure increases in proportion to the thickness of the superjunction structure. Therefore, realization of a high-breakdown voltage device requires a thick superjunction structure. In general, the superjunction structure is formed by a method of repeating ion implantation and epitaxial growth or a method of forming trenches in a semiconductor layer, followed by crystal growth to bury a semiconductor layer in the trenches. Accordingly, formation of a thick superjunction structure requires an increase in the number of repetitions of ion implantation and epitaxial growth, and an increase in the depth of the trench.

SUMMARY OF THE INVENTION

In one aspect the present invention provides a semiconductor device, which comprises a first semiconductor layer of a first conduction type; a first pillar layer including first semiconductor pillar layers of the first conduction type and second semiconductor pillar layers of a second conduction type arranged on the first semiconductor layer periodically at a first period; a second pillar layer including third semiconductor pillar layers of the first conduction type and fourth semiconductor pillar layers of the second conduction type arranged on the first pillar layer periodically at a second period smaller than the first period, said third semiconductor pillar layer being arranged so as to contact with the first semiconductor pillar layer; a first main electrode electrically connected to the first semiconductor layer; a semiconductor base layer of the second conduction type selectively formed on a surface of the fourth semiconductor pillar layer; a semiconductor diffused layer of the first conduction type selectively formed on a surface of the semiconductor base layer; a second main electrode formed in contact with the semiconductor base layer and the semiconductor diffused layer; and a control electrode formed adjacent via an insulation film to the semiconductor base layer, the semiconductor diffused layer, and the third semiconductor pillar layer.

In one aspect the present invention provides a method of manufacturing semiconductor devices. The method comprises forming on a surface of a first semiconductor layer of a first conduction type, first semiconductor pillar layers of the first conduction type and second semiconductor pillar layers of a second conduction type laterally, periodically and alternately at a first period to form a first pillar layer; forming third semiconductor pillar layers of the first conduction type and fourth semiconductor pillar layers of the second conduction type above the first pillar layer laterally, periodically and alternately at a second period smaller than the first period to form a second pillar layer, said third semiconductor pillar layer being arranged so as to contact with the first semiconductor pillar layer; and forming a semiconductor base layer of the second conduction type on a surface of the fourth semiconductor pillar layer, and forming a semiconductor layer of the first conduction type on a surface of the semiconductor base layer, the semiconductor layer being connected to a second main electrode. The first pillar layer is formed by executing the step of crystal-growing a semiconductor layer of the first conduction type, and the step of implanting impurity ions into the semiconductor layer of the first conduction type at the first period, at least once, followed by executing the step of diffusing the ion-implanted impurity in an additional heat treatment.

DETAILED DESCRIPTION OF THE INVENTION

Embodiments of the present invention will now be described in detail with reference to the drawings.

First Embodiment

Figure 1:
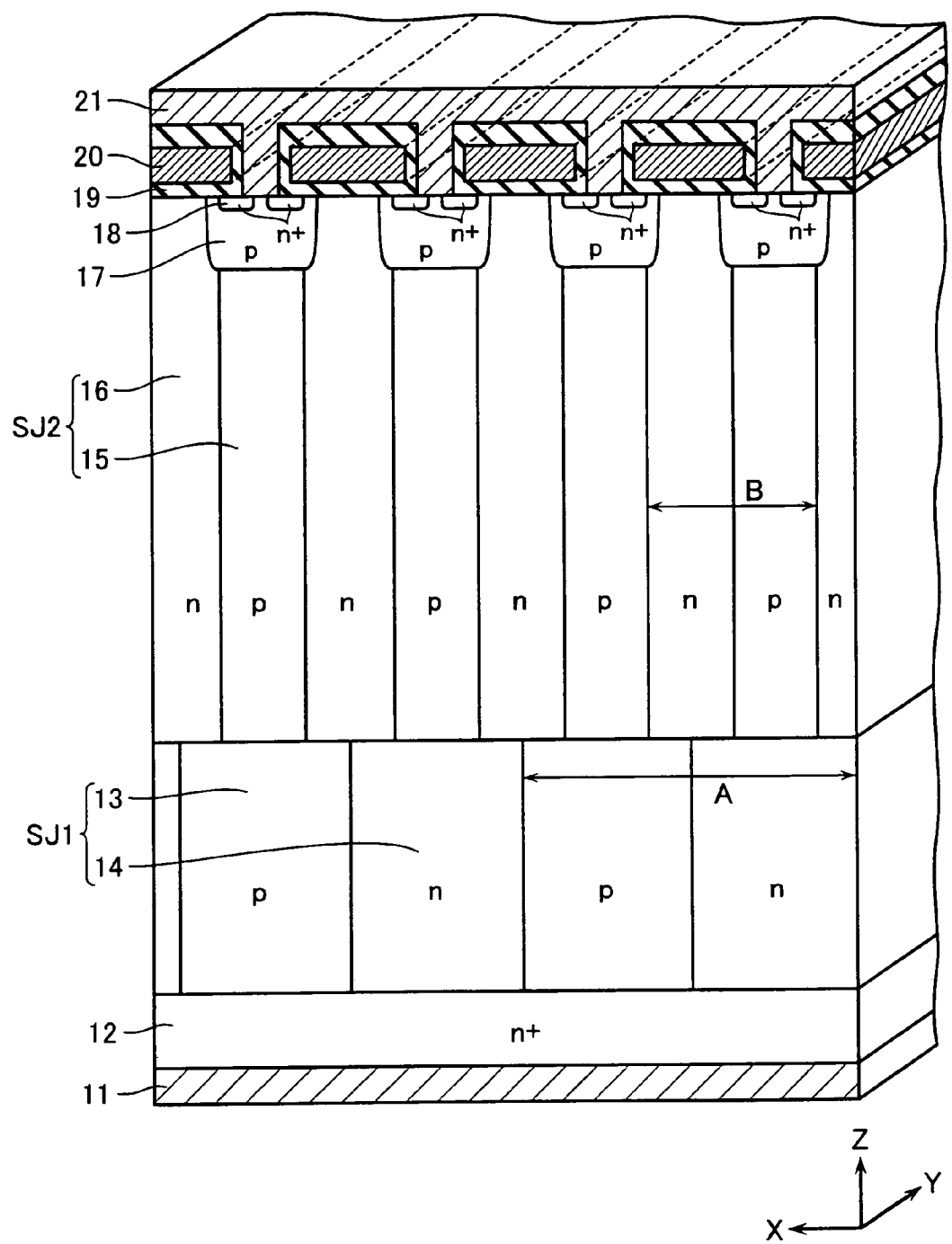
FIG. 1 is a cross-sectional view schematically showing a structure of a power MOSFET according to a first embodiment of the present invention.

FIG. 1 is a cross-sectional view schematically showing a structure of a power MOSFET according to a first embodiment of the present invention. This MOSFET includes an $n^+$-type drain layer 12. A lower pillar layer SJ1 is formed on the upper surface of the $n^+$-type drain layer 12, and an upper pillar layer SJ2 is stacked thereon. Thus, the MOSFET adopts a superjunction structure having a drift layer with a two-layered structure of the lower pillar layer SJ1 and the upper pillar layer SJ2.

The lower pillar layer SJ1 includes lower p-type pillar layers 13 and lower n-type pillar layers 14 formed alternatively at a lateral period A. On the other hand, the upper pillar layer SJ2 includes upper p-type pillar layers 15 and upper n-type pillar layers 16 formed alternatively at a lateral period B smaller than the period A (B<A). Note that the period A and B are determined so that the lower n-type pillar layer 14 is connected to the upper n-type pillar layer 16 to form a drift layer successively. In this embodiment, the pillar layers 13, 14, 15, 16 each have a stripe shape that exhibits a lengthwise rectangle in section along the page (X-Z plane) and extends in the direction normal to the page (Y direction) as shown in FIG. 1.

In the upper surface of the p-type pillar layer 15 in the upper pillar layer SJ2, a p-type base layer 17 is formed by diffusion, and in the upper surface of the p-type base layer 17, an n-type source layer 18 is selectively formed by diffusion. The p-type base layer 17 and the n-type source layer 18 are also formed in the stripe shape that extends in the Y direction, like the pillar layers 13-16.

There is a region extending from the p-type base layer 17 and the n-type source layer 18 on one side through the upper n-type pillar layer 16 to the p-type base layer 17 and the n-type source layer 18 on the other side. A gate electrode 20 is formed in a stripe shape on the region, interposing a gate insulation film 19 composed of a silicon oxide film having a thickness of about 0.1 µm there between. A source electrode 21 is formed over the p-type base layer 17 and the n-type source layer 18, sandwiching the gate electrode 20 there between. A drain electrode 11 is formed on the lower surface of the $n^+$-type drain layer 12. The gate electrode 20 and the source electrode 21 are also formed in the stripe shape that has the longitudinal direction in the Y direction, like the n-type source layer 18.

The conventional superjunction-structured MOSFET includes n-type pillar layers and p-type pillar layers formed at an identical lateral period over the depth of the drift layer. The breakdown voltage of the superjunction structure is proportional to the thickness of the superjunction structure. Accordingly, a higher breakdown voltage requires a thicker pillar layer. In general, the superjunction structure is formed by a method of repeating ion implantation and burying growth multiple times or by burying growth in deep trenches. Formation of a high breakdown voltage device increases the number of burying steps and the depth of trenches, resulting in a complicated process.

Therefore, the MOSFET of the present embodiment includes multi-stage superjunction structures formed at different lateral periods and stacked in the vertical direction as shown in FIG. 1. This is effective to achieve both a high breakdown voltage and a low on-resistance without any complicated process. The MOSFET of the present embodiment has a breakdown voltage equal to the sum of breakdown voltages across the upper and lower pillar layers SJ1 and SJ2. The lower pillar layer SJ1 has a wider lateral period A, a smaller aspect ratio, and smaller thickness compared to the upper pillar layer SJ2, and accordingly can be formed easily. On the lower pillar layer SJ1, the upper pillar layer SJ2 is formed at a lateral period B, which is designed smaller. The thickness of the lower pillar layer SJ1 may be determined to provide a required increase in breakdown voltage. In this case, the thickness of the upper pillar layer SJ2 may be sufficient if it is almost equal to the conventional one. Therefore, it is possible to achieve a high breakdown voltage MOSFET without any complicated process.

For example, formation of a 900 V breakdown voltage MOSFET in the conventional process requires formation of a superjunction structure having an about 1.5-fold thickness compared to a 600 V breakdown voltage device, thus resulting in a complicated process. In the structure of the present embodiment, however, if the lower pillar layer SJ1 can retain a breakdown voltage of 300 V and the upper pillar layer SJ2 can retain a breakdown voltage of 600V, a 900 V breakdown voltage device can be realized. The process for the lower pillar layer SJ1 is simple, and the process for the upper pillar layer SJ2 may be similar to that for the conventional 600 V breakdown voltage device. The thickness of the upper pillar layer SJ2 can be the same as that of the conventional device. Therefore, this embodiment is possible to achieve a 900 V breakdown voltage device without any complicated process.

Application of a high voltage across source-drain in such the power MOSFET can deplete the upper and lower pillar layers SJ1 and SJ2 completely. When a gate voltage is applied on the gate electrode 10 to achieve ON-state, the carrier flows in the upper and lower pillar layers SJ1 and SJ2 to vanish the depletion layers. Flowing of the carrier requires connection of the lower p-type pillar layer 13 to the source electrode 21 through any one of the upper p-type pillar layers 15 and the p-type base layers 17.

Figure 2:
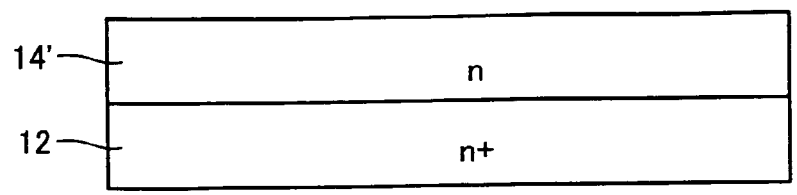
FIG. 2 shows an example of the specific process step of manufacturing the power MOSFET of the first embodiment.
Figure 3:
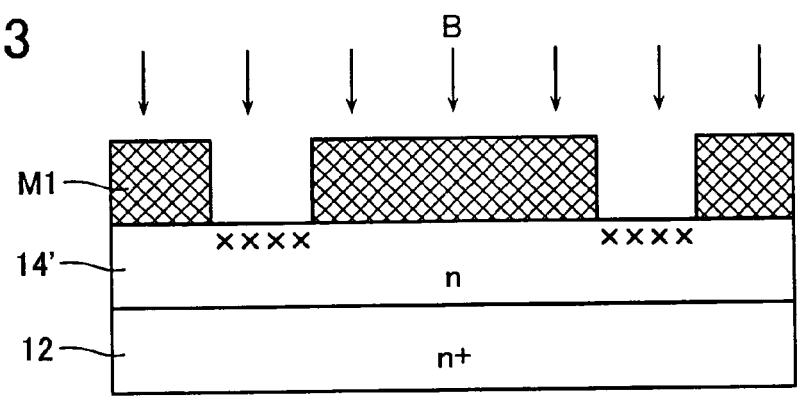
FIG. 3 shows an example of the specific process step of manufacturing the power MOSFET of the first embodiment.

Specific process steps of manufacturing the MOSFET of this embodiment will be described with reference to FIGS. 2-8. First, as shown in FIG. 2, an n-type layer 14' is crystal-grown on the $n^+$-type drain layer 12. The layer 14' is to be turned into the lower n-type pillar layers 14. Next, as shown in FIG. 3, a lithography process is applied to form a pattern of resist M1 on the n-type layer 14', and then ions of boron (B) are implanted into the n-type layer 14' with a mask of the resist M1. The resist M1 is designed to have a formation interval equal to the lateral period A in the lower pillar layer SJ1.

Figure 4:
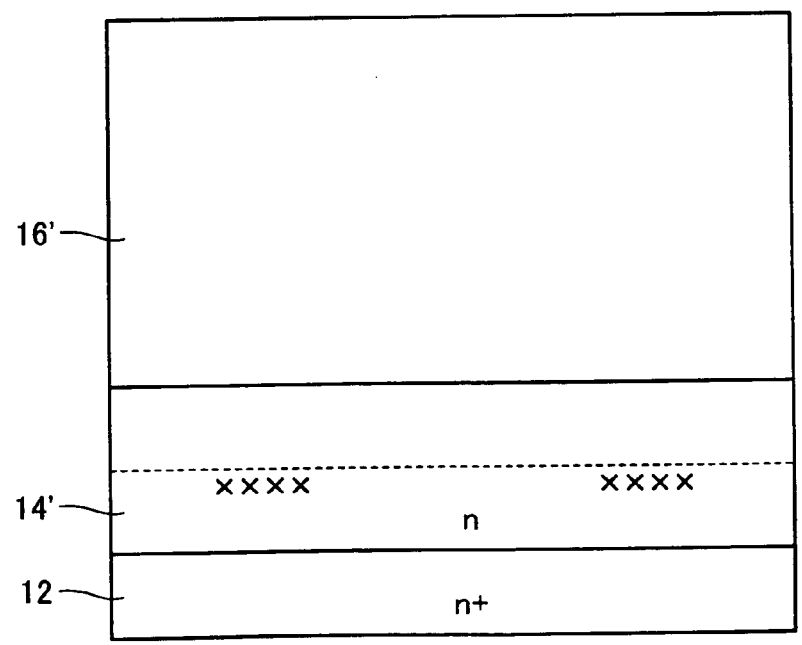
FIG. 4 shows an example of the specific process step of manufacturing the power MOSFET of the first embodiment.
Figure 5:
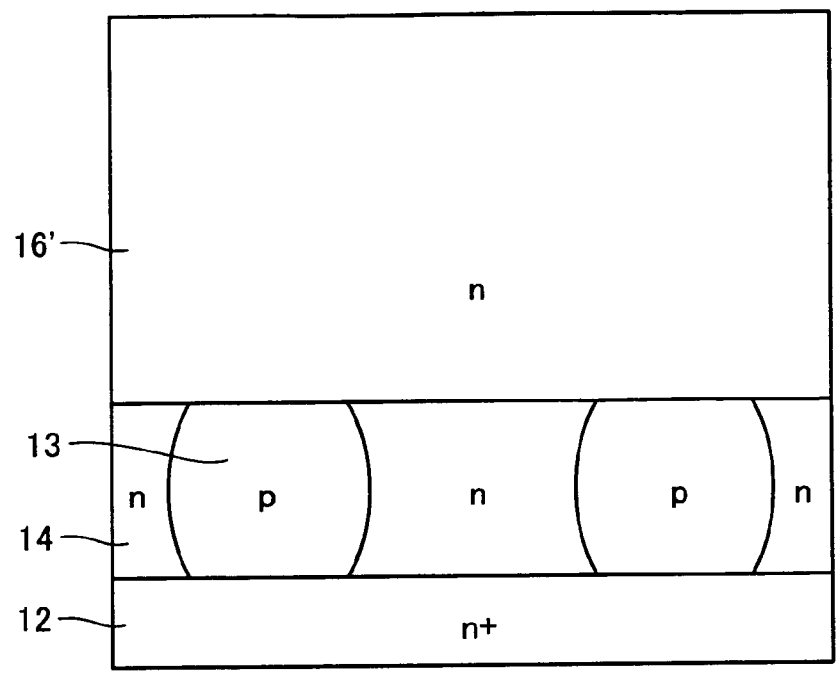
FIG. 5 shows an example of the specific process step of manufacturing the power MOSFET of the first embodiment.

After B ion implantation, the n-type layer 14' is deposited with a predetermined thickness as shown in FIG. 4. Then, an n-type layer 16' is formed thereon, which is to be turned into the upper n-type pillar layers 16. Thereafter, a heat treatment is applied to the n-type layer 14' almost at 1150° C. for 10 hours to diffuse boron implanted into the n-type layer 14' to form the lower p-type pillar layers 13. Thus, the lower p-type pillar layers 13 and the lower n-type pillar layers 14 are formed laterally and alternately to form the lower pillar layer SJ1. Through this step, the impurity profile in each of the pillar layers 13 has a mountain- or wave-shape as shown in FIG. 5.

Figure 6:
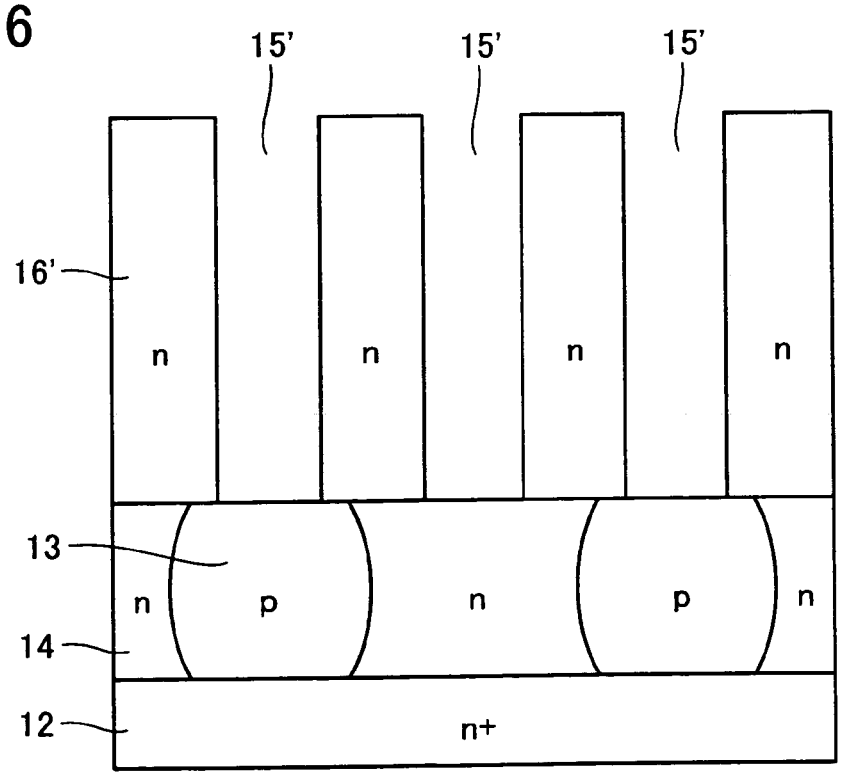
FIG. 6 shows an example of the specific process step of manufacturing the power MOSFET of the first embodiment.
Figure 7:
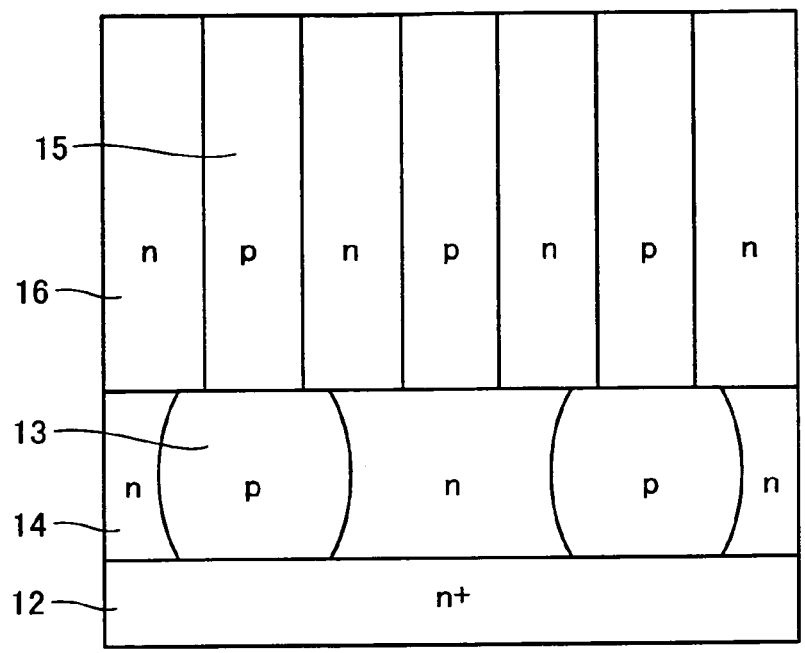
FIG. 7 shows an example of the specific process step of manufacturing the power MOSFET of the first embodiment.
Figure 8:
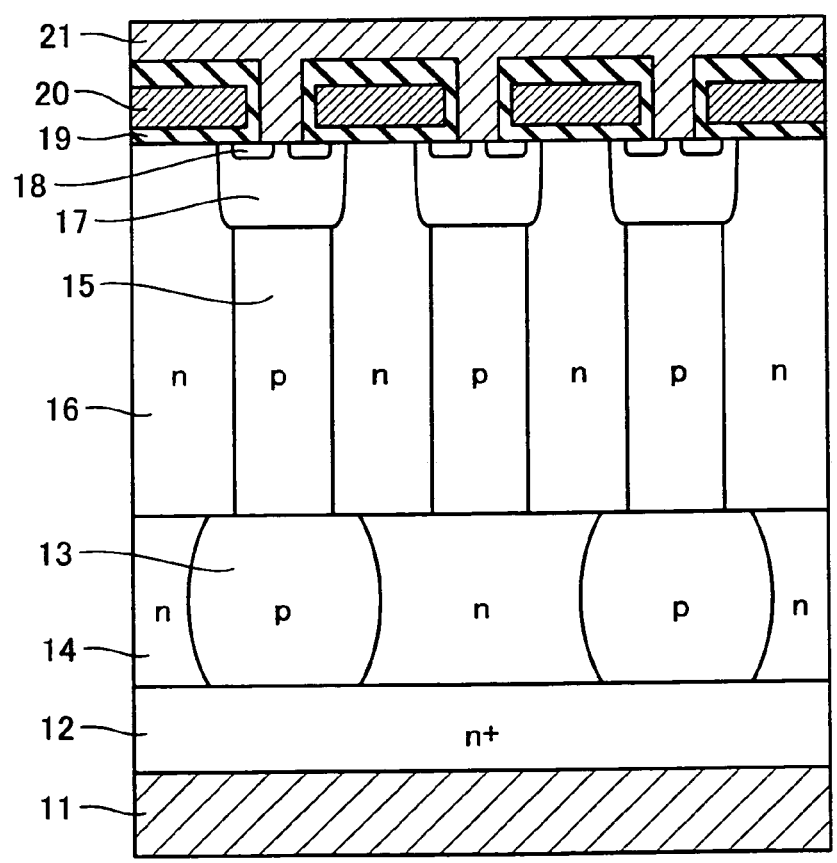
FIG. 8 shows an example of the specific process step of manufacturing the power MOSFET of the first embodiment.

Subsequently, processes of photolithography and etching are applied to form trenches 15' in the n-type layer 16' as shown in FIG. 6 at a lateral period B (B<A). Further, a p-type semiconductor layer is buried in the trench 15' by epitaxial growth as shown in FIG. 7 to form the upper p-type pillar layers 15. Thus, the upper p-type pillar layers 15 and the upper n-type pillar layers 16 are formed laterally and alternately to form the upper pillar layer SJ2. The upper surface of the upper pillar layer SJ2 is planarized through a process of chemical mechanical polishing (CMP). Finally, in accordance with well-known process steps of manufacturing power MOS transistors, the p-type semiconductor base layer 17 is formed on the p-type semiconductor pillar layer 15. Then, the n-type source layer 18 is selectively formed in the upper surface of the p-type semiconductor base layer 17. Next, through well-known MOS transistor process steps, the gate insulation film 19, the gate electrode 20, the source electrode 21 and the drain electrode 11 are respectively formed to complete the superjunction-structured power MOSFET. As described above, the lower pillar layer SJ1 has the lateral period A larger than the lateral period B in the upper pillar layer SJ2 and accordingly can be formed with a smaller number of burying steps. On the other hand, if the upper pillar layer SJ2 is formed at an aspect ratio similar to the conventional one, it is possible to produce a MOSFET with a higher breakdown voltage than the conventional one, because of the presence of the lower pillar layer SJ1.

The structure of the present embodiment is possible to achieve not only a high breakdown voltage through simple process steps but also an on-resistance equal to or lower than that of the conventional structure. In an example, the conventional 600 V breakdown voltage superjunction-structured vertical MOSFET is assumed to have an on-resistance of 20 mΩcm². In this case, when the thickness of the superjunction structure is increased by 1.5 times in the conventional structure to achieve a 900 V breakdown voltage, the on-resistance becomes 55 mΩcm² because the on-resistance is proportional to the 2.5 power of the breakdown voltage.

On the other hand, when the lower pillar layer with the larger lateral period is added as is in the structure of this embodiment, the on-resistance is estimated at about 39 mΩcm² at the minimum and about 58 mΩcm² at the maximum like the conventional structure. In the structure of this embodiment, the breakdown voltage of the whole device is determined from the sum of the breakdown voltage of the upper pillar layer SJ2 and the breakdown voltage of the lower pillar layer SJ1. This is similar to the on-resistance because the on-resistance of the whole device is determined from the sum of the on-resistance of the upper pillar layer SJ2 and the on-resistance of the lower pillar layer SJ1.

When the upper pillar layer SJ2 has a breakdown voltage of 600 V and an on-resistance of 20 mΩcm², the lower pillar layer SJ1 may be designed to have a breakdown voltage of 300 V to achieve a 900 V breakdown voltage as the whole device. In this case, the lower pillar layer SJ1 has a thickness of about 20 μm. As is in the above process steps, when the step of growing the epitaxial layer and implanting impurity ions is repeated only once to form the lower pillar layer SJ1, the aspect ratio is equal to 1 to 2. Accordingly, the lower pillar layer SJ1 has a lateral period of 20-40 μm. In this case, the lower pillar layer SJ1 has an on-resistance of 19-38 mΩcm². Therefore, the whole device has an on-resistance equal to the sum of the on-resistance of the upper pillar layer SJ2 (20 mΩcm²) and the on-resistance of the lower pillar layer SJ1 (19-38 mΩcm²).

As described above, stacking the lower pillar layer SJ1, which can be formed by repeating the steps of epitaxial growth and impurity ion implantation once, below the upper pillar layer SJ2 makes it possible to realize an on-resistance similar to or lower than the conventional one. If the aspect ratio of the lower pillar layer SJ1 is larger than 1.4, the on-resistance can be made smaller than that of the conventional structure.

Figure 9:
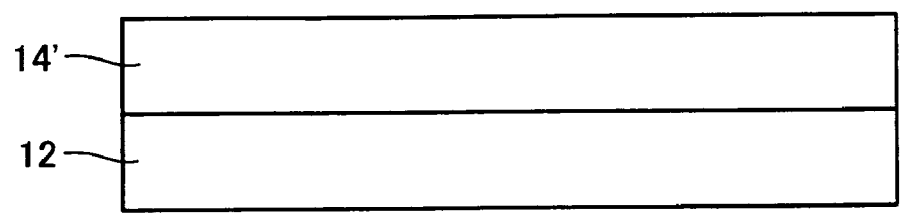
FIG. 9 shows another example of the specific process step of manufacturing the power MOSFET of the first embodiment.
Figure 10:
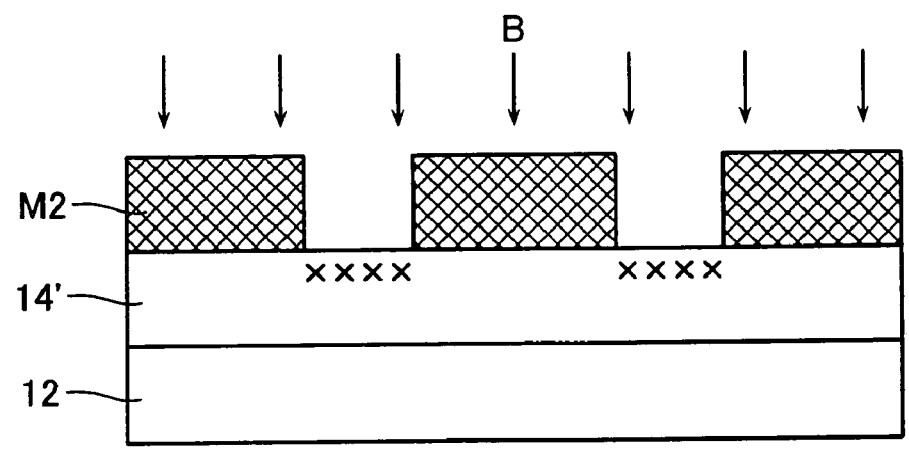
FIG. 10 shows another example of the specific process step of manufacturing the power MOSFET of the first embodiment.
Figure 11:
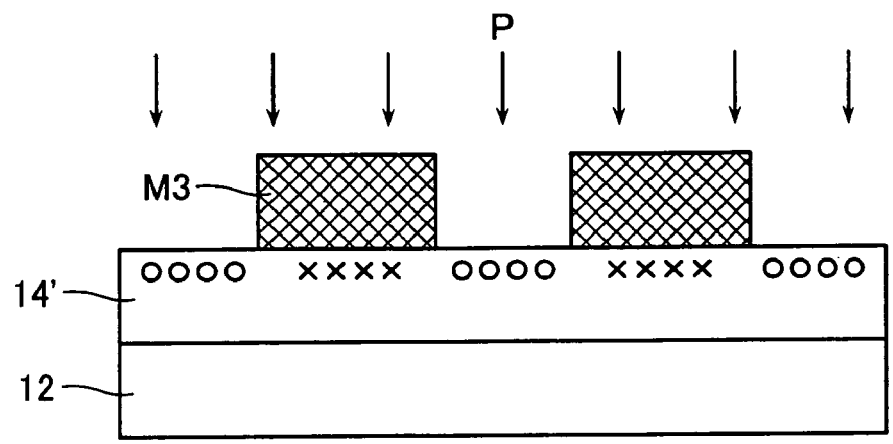
FIG. 11 shows another example of the specific process step of manufacturing the power MOSFET of the first embodiment.

An other process steps of manufacturing the MOSFET of this embodiment will be described with reference to FIGS. 9-16. First, as shown in FIGS. 9 and 10, the n-type layer 14' is grown on the $n^+$-type drain layer 12, and a lithography process is applied to form a pattern of resist M2 on the n-type layer 14'. Then, ions of boron (B) are implanted into the n-type layer 14' with a mask of the resist M2. The resist M2 is designed to have a formation interval equal to the lateral period A in the lower pillar layer SJ1. Subsequently, the resist M2 is peeled off, and then a pattern of resist M3 is formed in regions in which the resist pattern M2 was not formed as shown in FIG. 11. The resist M3 is employed as a mask to implant ions of phosphorous (P) into the n-type layer 14' to implant phosphorous in between portions containing boron previously implanted.

Figure 12:
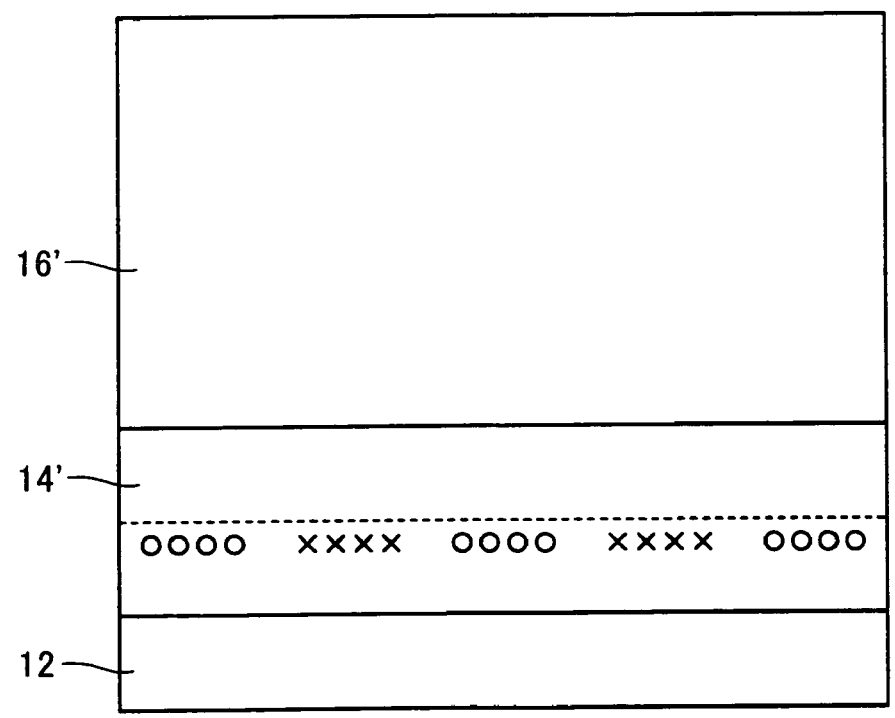
FIG. 12 shows another example of the specific process step of manufacturing the power MOSFET of the first embodiment.
Figure 13:
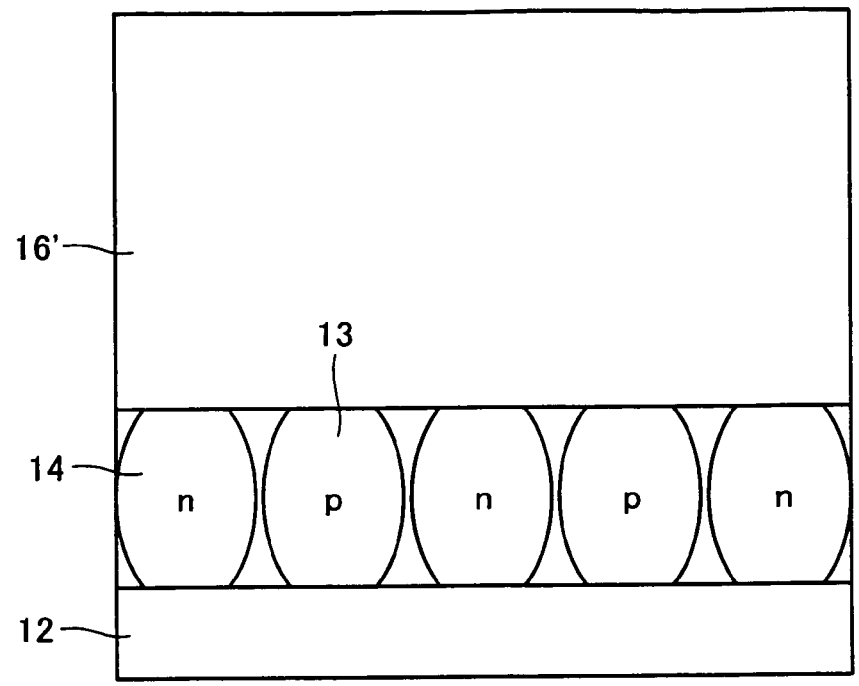
FIG. 13 shows another example of the specific process step of manufacturing the power MOSFET of the first embodiment.

After the ion implantation, the n-type layer 14' is deposited with a predetermined thickness as shown in FIG. 12. Then, the n-type layer 16' is formed thereon, which is to be turned into the upper n-type pillar layers 16. Thereafter, a heat treatment is applied to the n-type layer 14' almost at 1150° C. for 10 hours to diffuse boron and phosphorous implanted into the n-type layer 14' to form the lower p-type pillar layers 13 and the lower n-type pillar layers 14. Thus, the lower p-type pillar layers 13 and the lower n-type pillar layers 14 are formed laterally and alternately to form the lower pillar layer SJ1.

Figure 14:
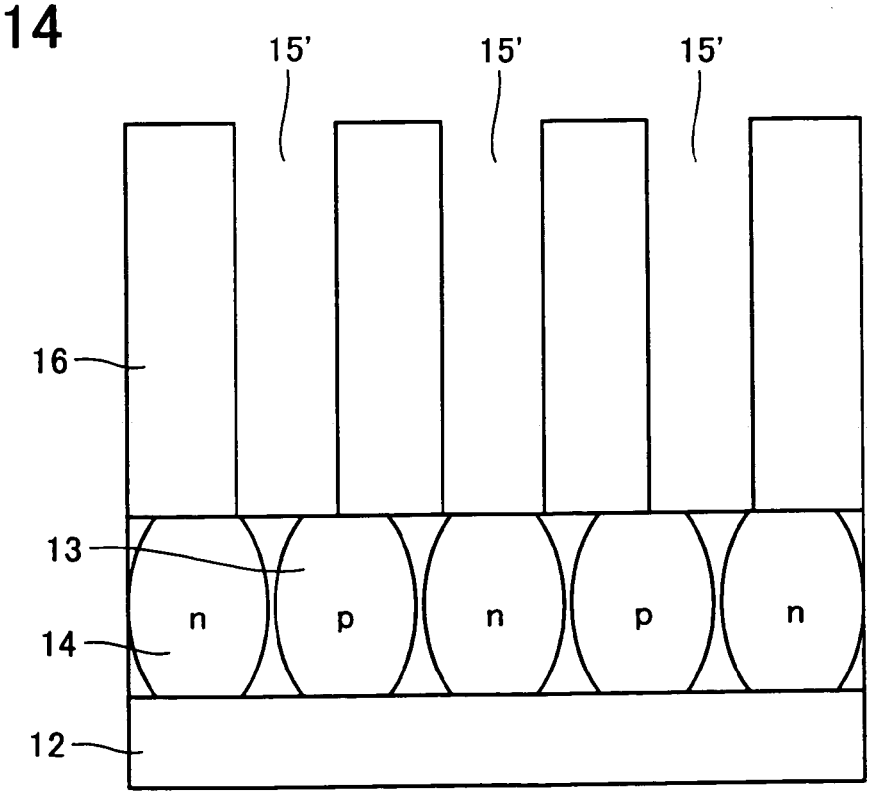
FIG. 14 shows another example of the specific process step of manufacturing the power MOSFET of the first embodiment.
Figure 15:
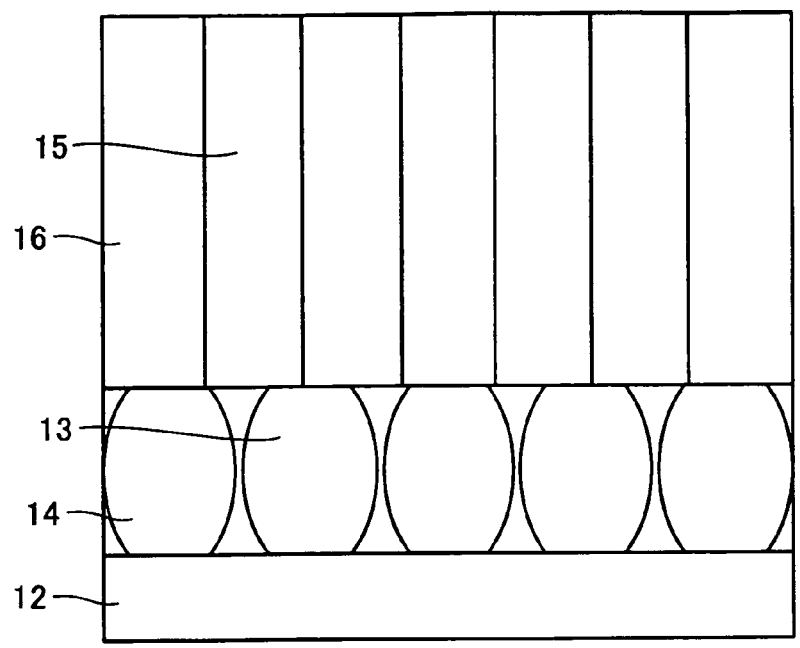
FIG. 15 shows another example of the specific process step of manufacturing the power MOSFET of the first embodiment.
Figure 16:
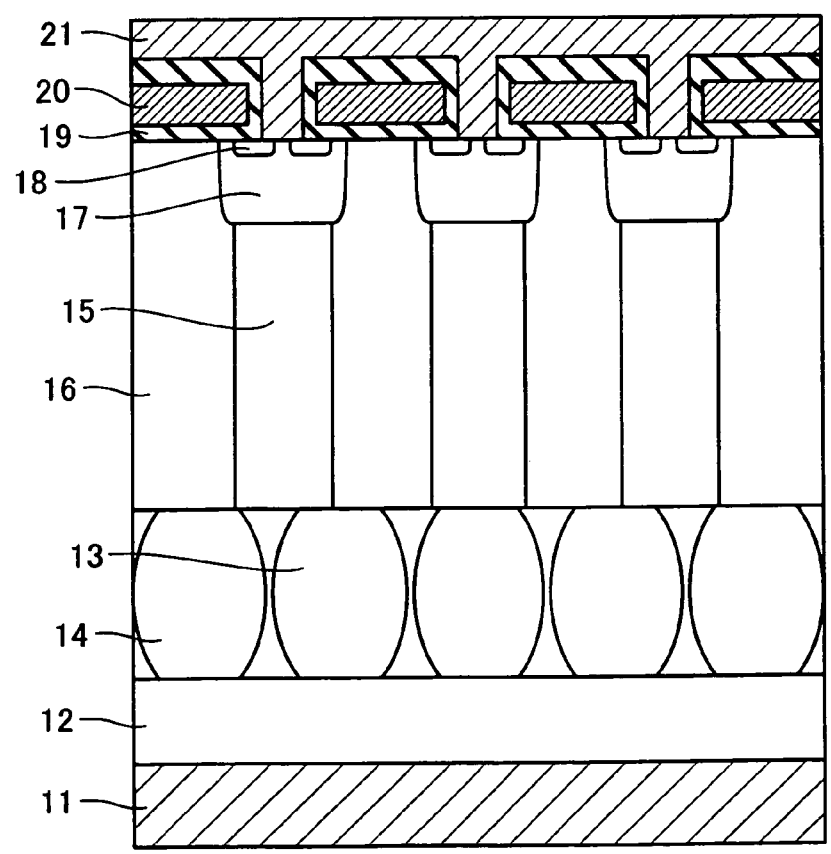
FIG. 16 shows another example of the specific process step of manufacturing the power MOSFET of the first embodiment.

Thereafter, as shown in FIGS. 14-16, like the steps shown in FIGS. 6-9, formation of the trench 15', burying growth of the p-type semiconductor layer into the trench 15', and CMP are executed to form the upper pillar layer SJ2. Then, well-known MOS transistor process steps are executed to complete the MOSFET as shown in FIG. 1.

As described in both the process steps of FIGS. 2-8 and the process steps of FIGS. 9-16, the lower pillar layer SJ1 is produced through the step of repeating ion implantation and epitaxial growth once though the step of repeating may also be implemented multiple times. The upper pillar layer SJ2 may be formed through the process of repeating ion implantation and epitaxial growth multiple times. The upper and lower pillar layers SJ1 and SJ2 may be formed through the step of repeating epitaxial growth and impurity ion implantation multiple times. In this case, it is effective on formation of the device that the lateral period in the upper pillar layer SJ2 is narrower than the lateral period in the lower pillar layer SJ1. In a word, as the lower pillar layer SJ1 has a longer lateral period, it takes a longer time to diffuse the impurity in the step of heating. On the other hand, as the upper pillar layer SJ2 has a shorter lateral period, it takes a much shorter time correspondingly to diffuse the impurity in the step of heating. Therefore, after the step of heating the lower pillar layer SJ1 having a longer diffusion time, the steps of epitaxial growth and impurity ion implantation are repeated, followed by the step of heating for a short time, to form the upper pillar layer SJ2.

Second Embodiment

Figure 17:
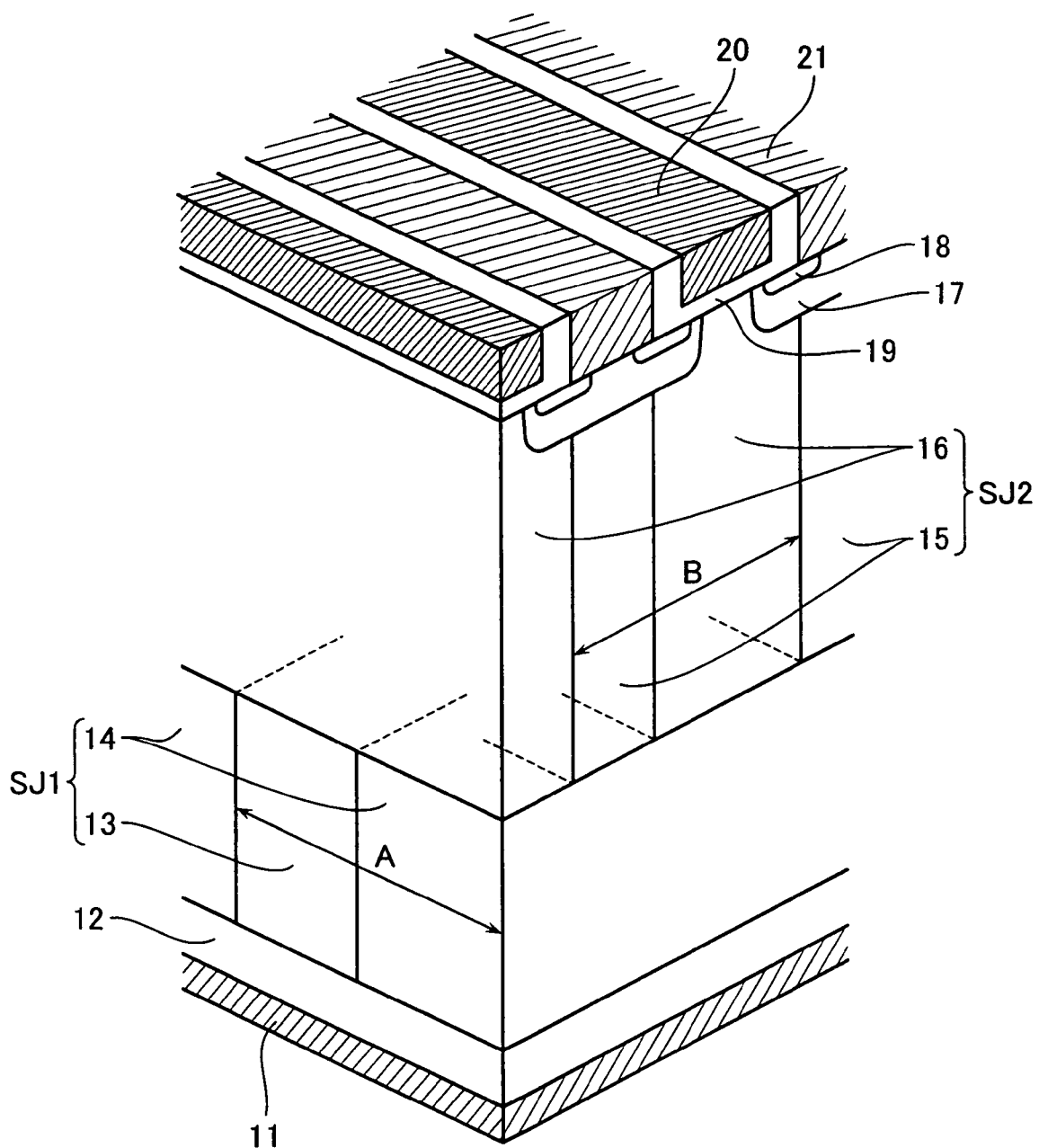
FIG. 17 is a cross-sectional view schematically showing a structure of a power MOSFET according to a second embodiment of the present invention.

FIG. 17 is a cross-sectional view schematically showing a structure of a power MOSFET according to a second embodiment of the present invention. The same parts as those in FIG. 1 are omitted from the following detailed description and only different parts are described herein.

The structure shown in FIG. 17 is the same as the structure of the first embodiment because the upper and lower pillar layers SJ1 and SJ2 are formed in the shape of stripes. It is different from the first embodiment, however, in that the pillar layers SJ1 and SJ2 are arranged such that the directions of extension of the stripe shapes intersect at a right angle. In the structure of the second embodiment, even if an error occurs in alignment of the upper and lower pillar layers SJ1 and SJ2, an increase in on-resistance can be suppressed. In a word, even when the upper and lower pillar layers SJ1 and SJ2 are formed in the shape of stripes and the directions of extension are determined in an identical direction like the first embodiment, there is no problem if alignment of both layers is accurate. When a displacement occurs between both and the lower p-type pillar layer 13 is not connected to any one of the upper p-type pillar layers 15, a current path is broken and the on-resistance increases correspondingly. To the contrary, as shown in the second embodiment, the upper and lower pillar layers SJ1 and SJ2 have the orthogonal directions of extension. In this case, the current path is not broken as above and the on-resistance is prevented from increasing even if an alignment error occurs.

Third Embodiment

Figure 18:
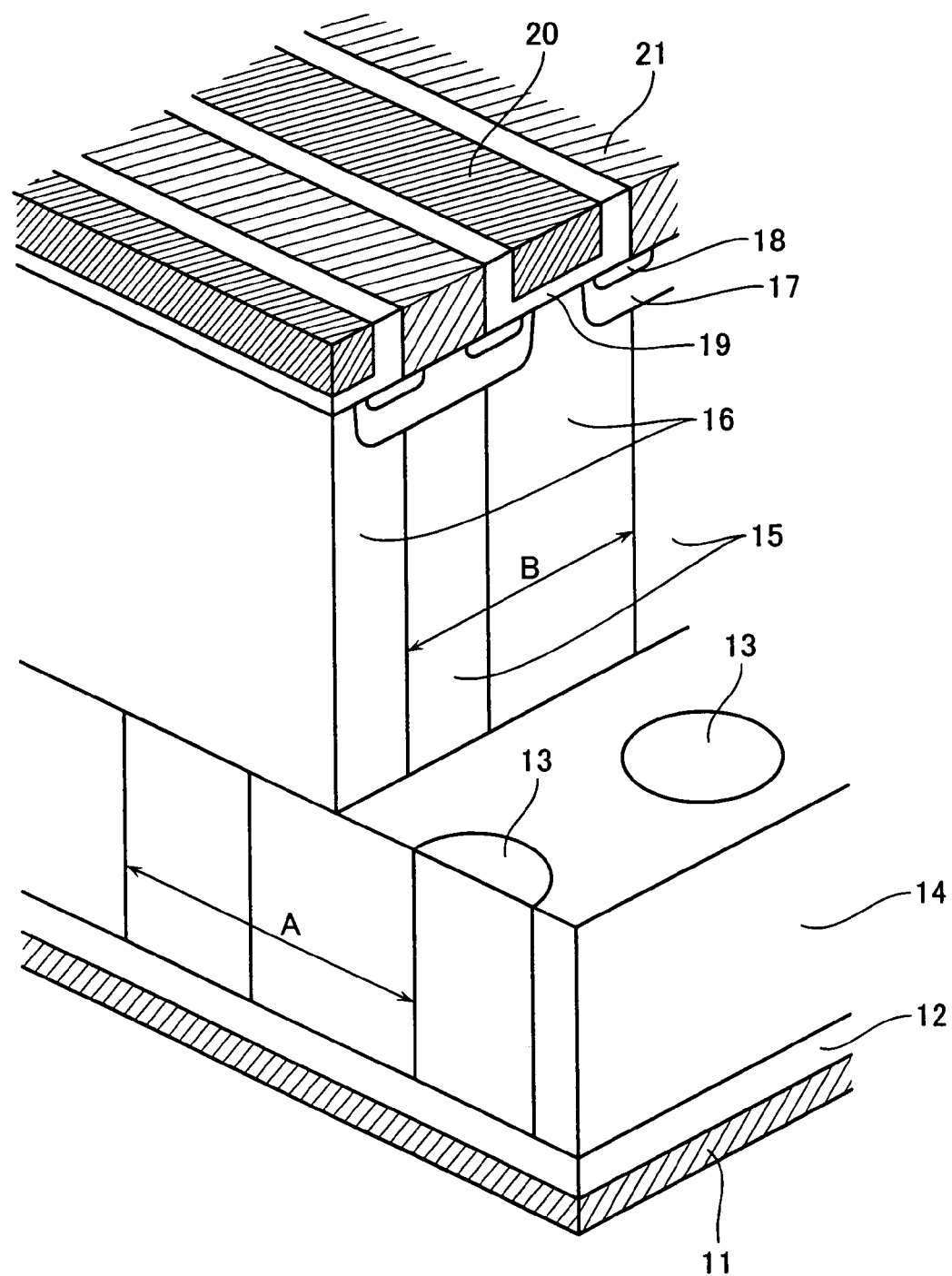
FIG. 18 is a cross-sectional view schematically showing a structure of a power MOSFET according to a third embodiment of the present invention.

FIG. 18 is a cross-sectional view schematically showing a structure of a power MOSFET according to a third embodiment of the present invention. The same parts as those in FIG. 1 are omitted from the following detailed description and only different parts are described herein.

In the structure shown in FIG. 18, the upper pillar layer SJ2 is formed in the shape of stripes similar to those in the above embodiments. On the contrary, the lower pillar layer SJ1 is formed such that the lower p-type pillar layers 13 are buried in the shape of a grid in an n-type layer, which is to be turned into the lower n-type pillar layers 14. Thus, in the lower p-type pillar layers 13, the current path connected to any one of the upper p-type pillar layers 15 is not broken. Accordingly, the on-resistance is prevented from increasing and the process can be simplified.

The lower p-type pillar layers 13 have a grid formation period A, which is made larger than the lateral period B in the upper pillar layer SJ2. Accordingly, even if a displacement occurs more or less, the lower p-type pillar layer 13 can be connected to any one of the upper p-type pillar layers 15. The lower p-type pillar layers 13 are independently separated and not laterally connected to each other. Therefore, the depletion layer can not extend to the end of the device formation region. Thus, formation of the upper pillar layer SJ2 requires no alignment with the lower pillar layer SJ1, thereby further simplifying the process steps.

The lower p-type pillar layers 13 may be formed in a staggered arrangement instead of the grid. In the staggered arrangement, in spacing between the lower p-type pillar layers 13 aligned in a certain line, each of the lower p-type pillar layers 13 aligned in an adjacent line is located.

In this case, a reliable connection between the upper p-type pillar layer 15 and the lower p-type pillar layer 13 desires the grid formation period A in the lower p-type pillar layers 13 to be made equal to an integer multiple of the lateral period B in the upper p-type pillar layers 15.

Fourth Embodiment

Figure 19:
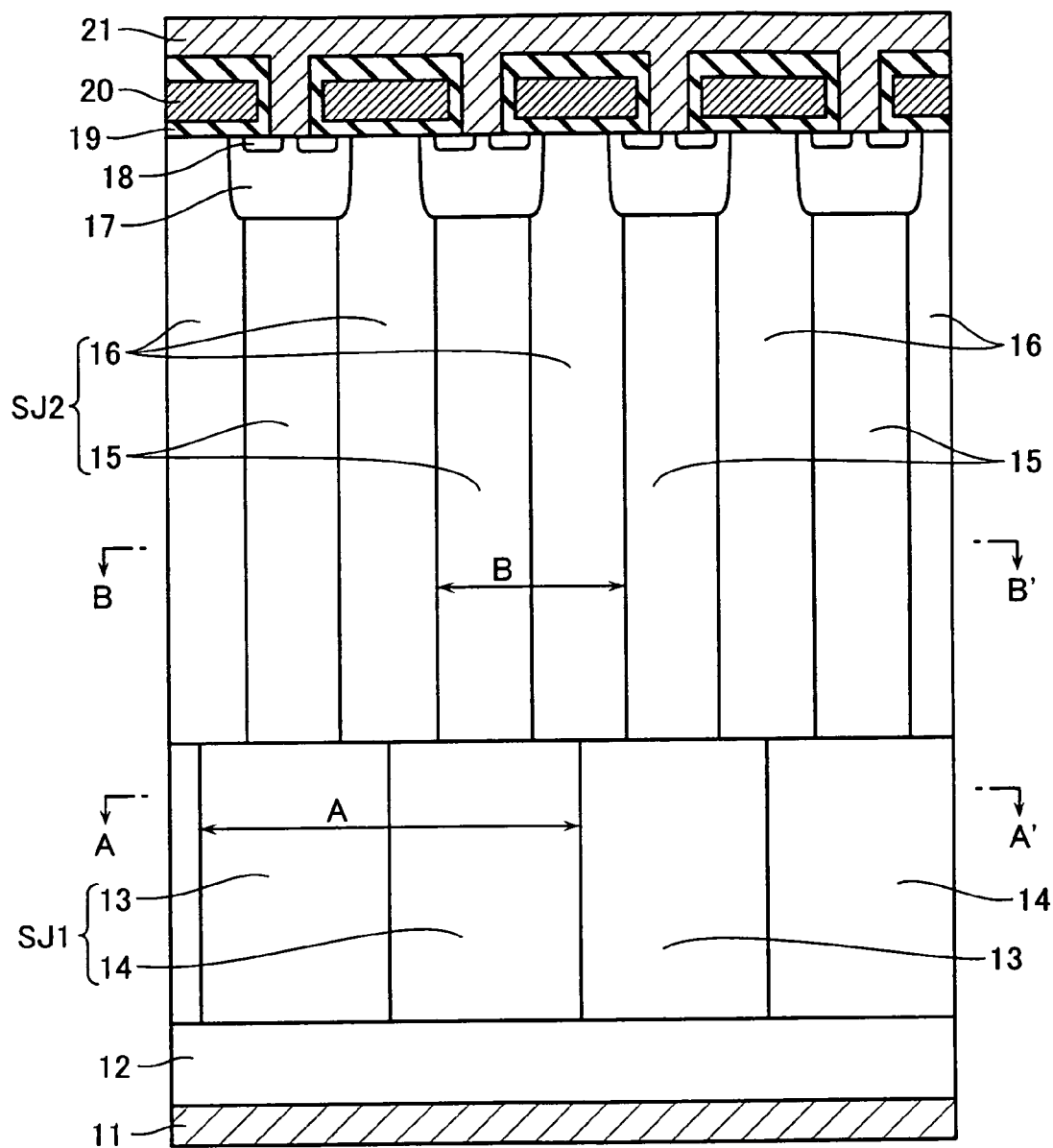
FIG. 19 is a cross-sectional view schematically showing a structure of a power MOSFET according to a fourth embodiment of the present invention.
Figure 20:
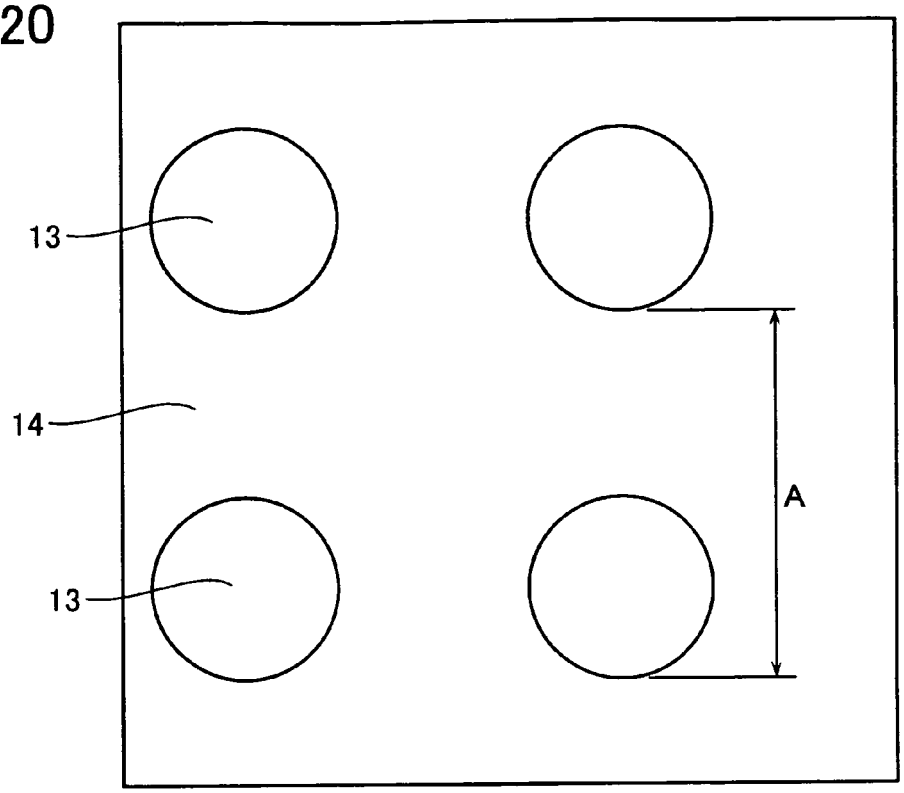
FIG. 20 is a cross-sectional view taken along A-A' in FIG. 19.
Figure 21:
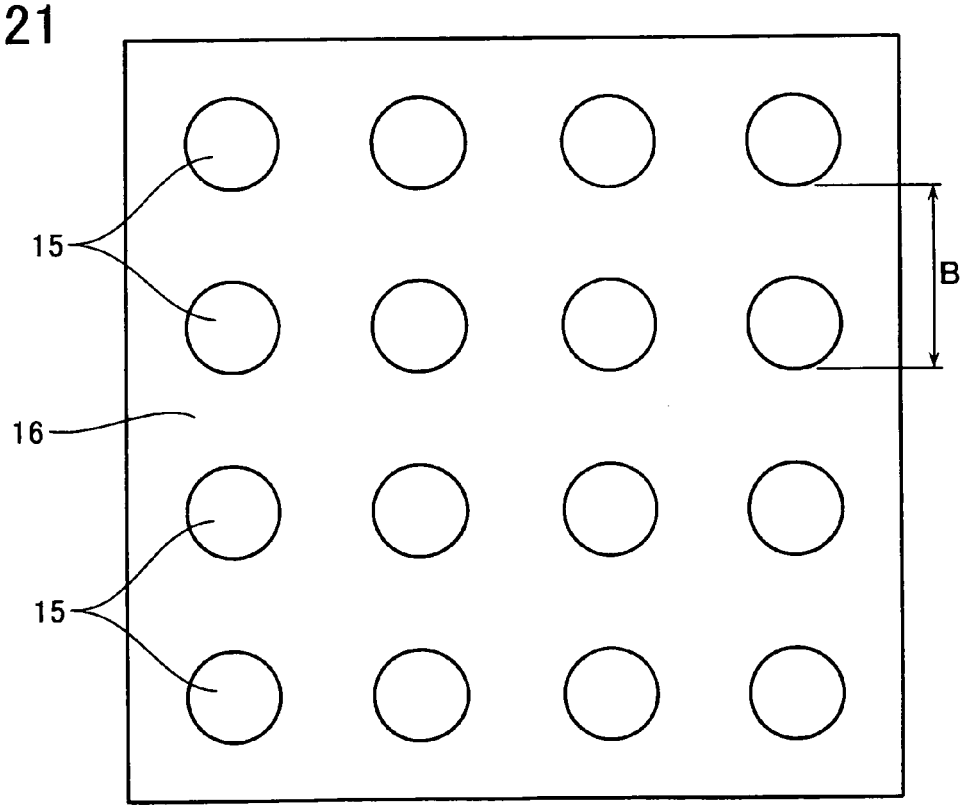
FIG. 21 is a cross-sectional view taken along B-B' in FIG. 19.

A fourth embodiment of the present invention will now be described with reference to FIGS. 19-21. FIG. 19 is a cross-sectional view schematically showing a structure of a power MOSFET according to the fourth embodiment. FIGS. 20 and 21 are cross-sectional views taken along A-A' and B-B', respectively, in FIG. 19. As shown in FIG. 20, in this embodiment, the upper pillar layer SJ2 is also formed in the shape of the grid such that the upper p-type pillar layers 15 are buried in the trenches formed in the n-type layer that configures the upper n-type pillar layers 16. This point is different from the above embodiments. The p-type base layer 17 and the gate electrode 20 are not shown in the figure though they are also formed in the shape of the grid along the upper n-type pillar layers 16. Also in this embodiment, the grid formation period A in the lower p-type pillar layers 13 is made larger than the grid formation period B in the upper p-type pillar layers 15. Therefore, the lower p-type pillar layers 13 can be connected to any one of the upper p-type pillar layers 15, leaving no problem on the increase in on-resistance and so forth.

Figure 22:
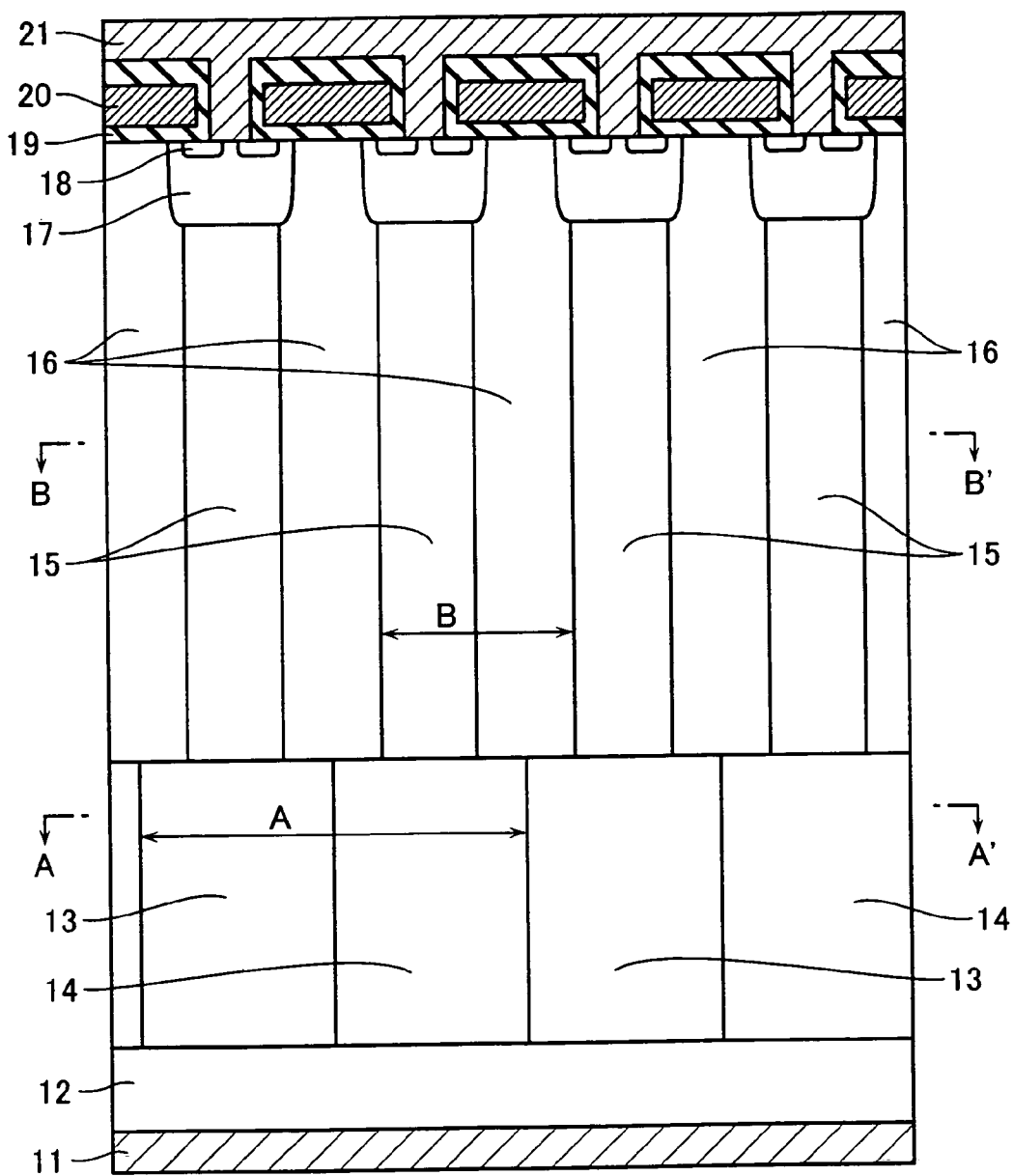
FIG. 22 is a cross-sectional view schematically showing a structure of a power MOSFET according to a modification of the fourth embodiment of the present invention.
Figure 23:
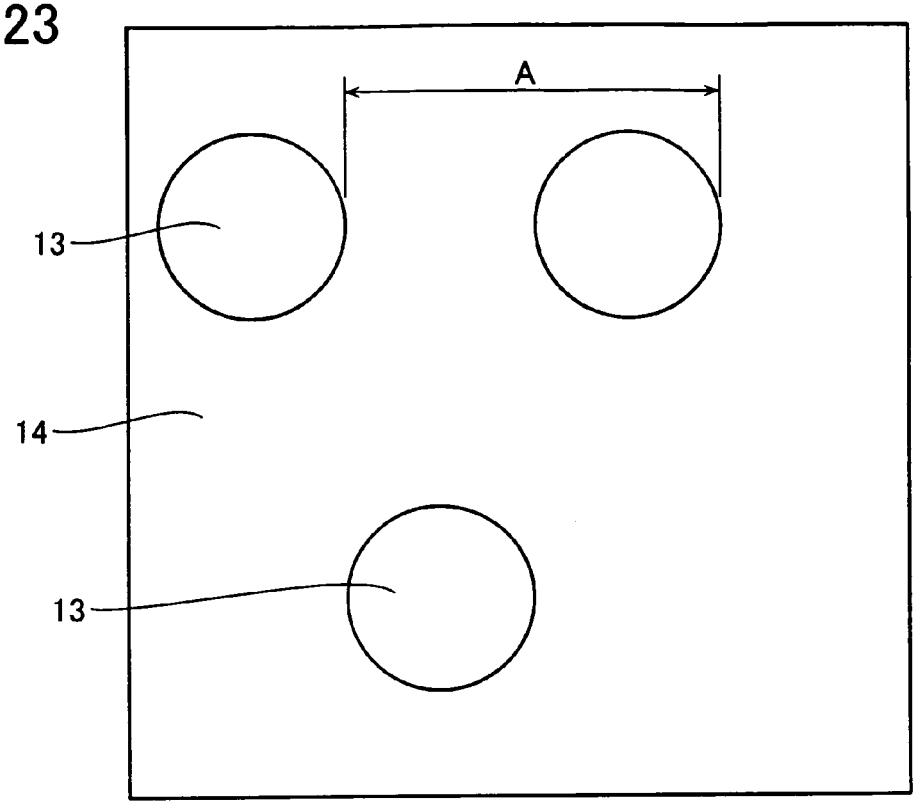
FIG. 23 is a cross-sectional view taken along A-A' in FIG. 22.
Figure 24:
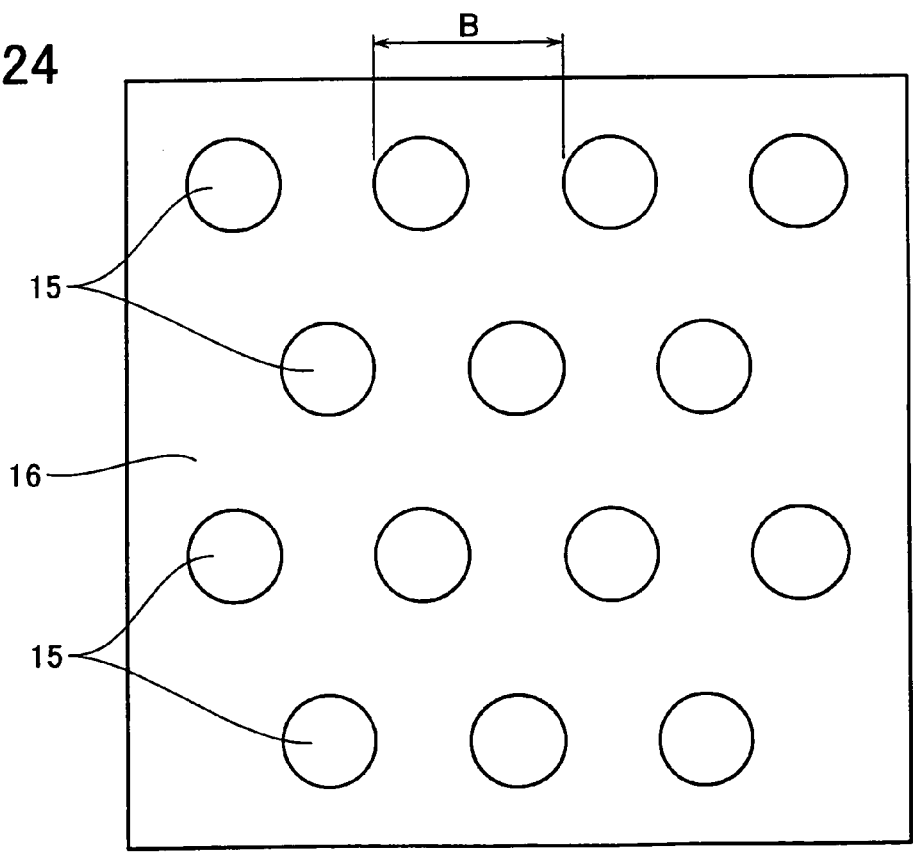
FIG. 24 is a cross-sectional view taken along B-B' in FIG. 22.

FIGS. 22-24 show a modification of the fourth embodiment. In this example, the upper p-type pillar layers 15 as well as the lower p-type pillar layers 13 are arranged not in a grid but in a staggered arrangement. Also in this case, the staggered grid formation periods in the upper p-type pillar layers 15 and the lower p-type pillar layers 13 are formed larger in the latter than in the former.

Also in this case, a reliable connection between the upper p-type pillar layer 15 and the lower p-type pillar layer 13 desires the grid period A in the lower p-type pillar layers 13 to be made equal to an integer multiple of the grid period B in the upper p-type pillar layers 15.

Although the embodiments of the invention have been described above, the present invention is not limited to these embodiments but rather can be given various modifications and additions without departing from the spirit and scope of the gist of the invention. For example, in the above embodiments the first conduction type is described as n-type and the second conduction type as p-type though the invention can be carried out when the first conduction type is changed to p-type and the second conduction type to n-type.

In the above embodiments the lower pillar layer 13 contacts the n+ type drain layer 12 though it is possible that the lower pillar layer 13 does not contact the n+ type pillar layer 12.

In the above embodiments the description is given to the example that employs the device having the planar gate structure as the gate electrode though the gate electrode having the trench gate structure can be adopted as well. In the above embodiments the p-type base layer and n-type source layer, and the gate electrode may be formed in the shape of a stripe, grid or staggered arrangement. In particular, when formed in the staggered arrangement, it may be formed in parallel with or orthogonal to the superjunction structure.

The MOSFET using silicon as the semiconductor is described though a compound semiconductor such as silicon carbide (SiC) and gallium nitride (GaN) or a wide band-gap semiconductor such as diamond may be employed as the semiconductor.

The MOSFET having the superjunction structure is described by way of example though the structure of the present invention is applicable to devices having the superjunction structure, for example, a hybrid device of SBD or MOSFET mixed with SBD, and other devices such as SIT and IGBT.

What is claimed is:

1. A semiconductor device, comprising:
   a first semiconductor layer of a first conduction type;
   a first pillar layer including first semiconductor pillar layers of said first conduction type and second semiconductor pillar layers of a second conduction type arranged on said first semiconductor layer laterally, periodically and alternately at a first period;
   a second pillar layer including third semiconductor pillar layers of said first conduction type and fourth semiconductor pillar layers of said second conduction type arranged on said first pillar layer laterally, periodically and alternately at a second period smaller than said first period, said third semiconductor pillar layer being arranged so as to contact with the first semiconductor pillar layer;
   a first main electrode electrically connected to said first semiconductor layer;
   a semiconductor base layer of said second conduction type selectively formed on a surface of said fourth semiconductor pillar layer;
   a semiconductor diffused layer of said first conduction type selectively formed on a surface of said semiconductor base layer;
   a second main electrode formed in contact with said semiconductor base layer and said semiconductor diffused layer; and
   a control electrode formed adjacent via an insulation film to said semiconductor base layer, said semiconductor diffused layer, and said third semiconductor pillar layer.

2. The semiconductor device according to claim 1, wherein each of said second semiconductor pillar layers is connected any one of said fourth semiconductor pillar layers.

3. The semiconductor device according to claim 2, wherein said first pillar layer has a smaller thickness compared to said second pillar layer.

4. The semiconductor device according to claim 2, wherein said first through fourth semiconductor pillar layers are formed in the shape of stripes having the longitudinal direction in an identical direction.

5. The semiconductor device according to claim 2, wherein said first and second semiconductor pillar layers are formed in the shape of stripes having the longitudinal direction in a first direction, and
   wherein said third and fourth semiconductor pillar layers are formed in the shape of stripes having the longitudinal direction in a second direction intersecting said first direction.

6. The semiconductor device according to claim 2, wherein said first and second semiconductor pillar layers or said third and fourth semiconductor pillar layers are formed in the shape of a grid or staggered arrangement in section along said first semiconductor layer.

7. The semiconductor device according to claim 2, wherein said first pillar layer is formed by executing the step of crystal-growing a semiconductor layer of said first conduction type, and the step of implanting impurity ions into said semiconductor layer of said first conduction type at said first period, at least once, followed by executing the step of diffusing said ion-implanted impurity in an additional heat treatment.

8. The semiconductor device according to claim 7, wherein the step of implanting impurity ions includes implanting ions of an impurity of said second conduction type at said first period, and then implanting ions of an impurity of said first conduction type in between portions containing said impurity of said second conduction type.

9. The semiconductor device according to claim 7, wherein the aspect ratio of said first pillar layer is equal to 1 to 2.

10. The semiconductor device according to claim 7, wherein said first pillar layer has a mountain- or wave-shape in the direction of the depth.

11. The semiconductor device according to claim 2, wherein said first pillar layer has a lateral period, which is an integer multiple of a lateral period of said second pillar layer.

12. The semiconductor device according to claim 3, wherein said first through fourth semiconductor pillar layers are formed in the shape of stripes having the longitudinal direction in an identical direction.

13. The semiconductor device according to claim 3, wherein said first and second semiconductor pillar layers are formed in the shape of stripes having the longitudinal direction in a first direction, and
   wherein said third and fourth semiconductor pillar layers are formed in the shape of stripes having the longitudinal direction in a second direction intersecting said first direction.

14. The semiconductor device according to claim 3, wherein said first and second semiconductor pillar layers or said third and fourth semiconductor pillar layers are formed in the shape of a grid or staggered arrangement in section along said first semiconductor layer.

15. The semiconductor device according to claim 3, wherein the aspect ratio of said first pillar layer is equal to 1 to 2.

16. The semiconductor device according to claim 3, wherein said first pillar layer has a mountain- or wave-shape in the direction of the depth.

17. The semiconductor device according to claim 3, wherein said first pillar layer has a lateral period, which is an integer multiple of a lateral period of said second pillar layer.

* * * * *